(12) United States Patent
Nakamura

(10) Patent No.: US 7,543,374 B2
(45) Date of Patent: Jun. 9, 2009

(54) METHOD OF MANUFACTURING WIRING SUBSTRATE

(75) Inventor: Junichi Nakamura, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 207 days.

(21) Appl. No.: 11/595,916

(22) Filed: Nov. 13, 2006

(65) Prior Publication Data
US 2007/0124925 A1 Jun. 7, 2007

(30) Foreign Application Priority Data
Dec. 7, 2005 (JP) ............... 2005-353142

(51) Int. Cl.
*H05K 3/02* (2006.01)
*H05K 3/36* (2006.01)
(52) U.S. Cl. ............... 29/846; 29/825; 29/830; 29/832; 438/107; 438/108; 438/761
(58) Field of Classification Search .......... 29/825, 29/830, 832; 438/107, 108, 761
See application file for complete search history.

(56) References Cited

U.S. PATENT DOCUMENTS

| | | | | |
|---|---|---|---|---|
| 6,391,220 B1 * | 5/2002 | Zhang et al. | ............... | 216/67 |
| 6,803,324 B2 * | 10/2004 | Ogawa et al. | ............... | 438/761 |
| 7,152,314 B2 * | 12/2006 | Shuto et al. | ............... | 29/830 |
| 7,377,030 B2 * | 5/2008 | Shuto et al. | ............... | 29/830 |
| 2003/0162386 A1 * | 8/2003 | Ogawa et al. | ............... | 438/637 |
| 2004/0211751 A1 * | 10/2004 | Shuto et al. | ............... | 216/13 |
| 2005/0155222 A1 * | 7/2005 | Nakamura | ............... | 29/830 |

FOREIGN PATENT DOCUMENTS

| | | |
|---|---|---|
| JP | 2004-87701 | 3/2004 |
| JP | 2004-235323 | 8/2004 |
| JP | 2005-63987 | 3/2005 |
| JP | 2005-236244 | 9/2005 |

* cited by examiner

*Primary Examiner*—C. J Arbes
(74) *Attorney, Agent, or Firm*—Kratz, Quintos & Hanson, LLP

(57) ABSTRACT

In a method of manufacturing a wiring substrate according to the present invention, a metal foil is tentatively fixed onto a temporary substrate, which is made of a nonwoven fabric impregnated with resin, by selectively attaching a peripheral side of the metal foil to an outer peripheral portion of a wiring formation region of the temporary substrate, thereafter, a build-up wiring layer is formed on the metal foil, and the metal foil is separated from the temporary substrate by cutting out an inside portion of a structure, the portion being inward from the adhesive layer, in this way, a wiring member including the build-up wiring layer formed on the metal foil is obtained.

12 Claims, 9 Drawing Sheets

METHOD OF MANUFACTURING WIRING SUBSTRATE

CROSS-REFERENCE TO RELATED APPLICATIONS

This application is based on and claims priority of Japanese Patent Application No. 2005-353142 filed on Dec. 7, 2005, the entire contents of which are incorporated herein by reference.

BACKGROUND OF THE INVENTION

1. Field of the Invention

The present invention relates to a method of manufacturing a wiring substrate and a method of manufacturing an electronic component mounting structure. More specifically, the present invention relates to a method of manufacturing a wiring substrate applicable to a mount substrate for an electronic component, and to a method of manufacturing an electronic component mounting structure for mounting an electronic component on the wiring substrate.

2. Description of the Related Art

As a wiring substrate for mounting an electronic component, there has heretofore been a method of obtaining a wiring substrate by forming a desired wiring layer on a temporary substrate in a detachable manner and then separating the wiring layer from the temporary substrate. Patent Literature 1 (Japanese Unexamined Patent Publication No. 2005-236244) discloses a method of obtaining a wiring substrate, which includes the steps of: forming a copper foil on a resin substrate while attaching only a peripheral side thereof by using an adhesive layer; forming a build-up wiring layer thereon; and thereafter separating the copper foil and the build-up wiring layer from the resin substrate by cutting out an inside portion of the resin substrate, the portion being inward from the adhesive layer.

Meanwhile, Patent Literature 2 (Japanese Unexamined Patent Publication No. 2004-87701) discloses a method of obtaining a wiring substrate, which includes the steps of: attaching a detachable film and a metal base onto the carrier plate by using an adhesive layer, the detachable film being smaller than a carrier plate, and the metal base having the same size as the carrier plate; forming a metal pad on the metal base; and thereafter, separating the metal base from the detachable film and the carrier plate by cutting out a peripheral portion of the detachable film of the wiring substrate.

Moreover, Patent Literature 3 (Japanese Unexamined Patent Publication No. 2004-235323) discloses a method of obtaining a wiring substrate, which includes the steps of: laminating a first metal layer and a second metal layer on a core substrate in a way that a position of an outer periphery of the first layer is located more inward than a position of an outer periphery of the second metal layer, and attaching both layers by use of an adhesive film; forming a build-up wiring layer on the second metal layer; and thereafter, separating the second metal layer and the build-up wiring layer from the first metal layer and the core substrate by cutting out a peripheral portion of the first metal layer of the wiring substrate.

Furthermore, Patent Literature 4 (Japanese Unexamined Patent Publication No. 2005-63987) discloses a method of obtaining a wiring substrate, which includes the steps of: forming a first dielectric sheet and a second dielectric sheet, located in a way that the second dielectric sheet wraps the first dielectric sheet, on a substrate provided with a groundwork dielectric sheet on an upper side; forming a wiring layer thereon; and thereafter by cutting out an outer peripheral portion of the first dielectric sheet of the wiring substrate, and thus separating the first dielectric sheet from the substrate provided with the groundwork dielectric sheet.

However, in the above-described manufacturing methods in the prior art, in many case, wrinkles may occur in the build-up wiring layer in a series of steps of forming the build-up wiring layer on the temporary substrate in the detachable state, by virtue of heat stress applied in heating steps in the manufacturing processes, the heat stress due to differences between the thermal expansion coefficients in the structures. Accordingly, these methods are not always sufficient in reliability.

SUMMARY OF THE INVENTION

It is an object of the invention to provide a method of manufacturing a wiring substrate which can be manufactured reliably and at low costs without causing any troubles in the method in which a build-up wiring layer is formed in a detachable state on a temporary substrate, and to provide a method of manufacturing an electronic component mounting structure for mounting an electronic component easily on the wiring substrate.

A method of manufacturing a wiring substrate according to the present invention includes the steps of, preparing a temporary substrate made of a nonwoven fabric impregnated with resin, tentatively fixing a metal foil onto at least one surface of the temporary substrate by selectively attaching a peripheral side of the metal foil to a peripheral portion of a wiring formation region on the temporary substrate with an adhesive layer, forming a build-up wiring layer on the metal foil; and obtaining a wiring member in which the build-up wiring layer is formed on the metal foil, by cutting out an inside portion of a structure in which the metal foil and the build-up wiring layer is formed on the temporary substrate, the portion being inward from the adhesive layer formed therein, and thus by separating the metal foil from the temporary substrate.

In the present invention, the nonwoven fabric impregnated with the resin is used as a temporary substrate, then the metal foil is tentatively fixed to the temporary substrate by selectively attaching the peripheral side of the metal foil to an outer peripheral portion of the wiring formation region of the temporary substrate with the adhesive layer, and the desired build-up wiring layer is formed thereon. Thereafter, by cutting out the inside portion being inward from the portion provided with the adhesive layer, the metal foil and the build-up wiring layer are separated from the temporary substrate to obtain the wiring member.

In a case where the metal foil is partially attached and thereby tentatively fixed to the temporary substrate, wrinkles are easy to be generated on the build-up layer in the process of forming the build-up wiring layer on the metal foil, when thermal expansion coefficients are different between the temporary substrate and the build-up wiring layer.

As a result studied wholeheartedly, the inventor of the present application has found out that it is possible to resolve the problem where wrinkles are generated in the build-up wiring layer in the following manner. That is, by using the nonwoven glass fabric epoxy resin substrate having an approximate thermal expansion coefficient to that of the build-up wiring layer as the temporary substrate, degrees of the thermal expansion become almost equal between the temporary substrate and the build-up wiring layer even when heat is applied in the manufacturing process. Thus, the above problem can be resolved.

In one preferred mode of the present invention, after the wiring member is obtained, the lowermost wiring layer of the build-up wiring layer is exposed by removing the metal foil. Then, one of the lowermost and uppermost wiring layers of the build-up wiring layer constitutes an internal connection pad for mounting an electronic component, and the wiring layer exposed on the opposite side constitutes an external connection pad.

Meanwhile, in a case where an electronic component is mounted on the wiring substrate of the present invention, after obtaining the wiring member by separating the metal foil and the build-up wiring layer from the temporary substrate, the electronic component is mounted on an upper surface side of the wiring member while leaving the metal foil on a lower face side, and then the lowermost wiring layer is exposed by removing the metal foil from the wiring member to obtain the external connection pad.

Since the metal foil functions as a reinforcing member, it becomes easy to convey or handle the wiring substrate without receiving an influence of warp rather than a case of mounting the electronic component after removing the metal foil, As the result, it is possible to mount the electronic component with high reliability.

Alternatively, it is also possible to mount the electronic component after forming the build-up wiring layer on the metal foil above the temporary substrate, and then to separate the metal foil from the temporary substrate by cutting out the structure. In a case of this aspect as well, the electronic component is mounted while the temporary substrate is present. Accordingly, it is possible to mount the electronic component with high reliability without receiving the influence of warp as similar to the above-described aspect.

As described above, according to the present invention, it is possible to manufacture a wiring substrate which has no a core substrate without generating any troubles.

DESCRIPTION OF THE PREFERRED EMBODIMENTS

Hereinafter, embodiments of the present invention will be described below with reference to the accompanying drawings.

First Embodiment

Figure 1A:
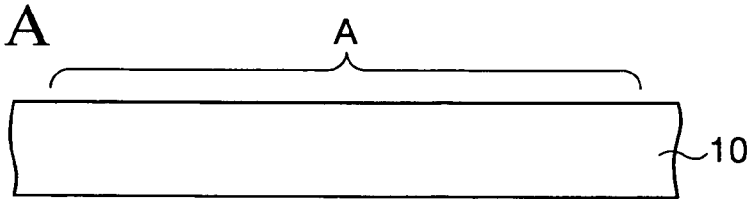
FIGS. 1A to 1K are cross-sectional views showing a method of manufacturing a wiring substrate according to a first embodiment of the present invention.

FIGS. 1A to 1K are cross-sectional views sequentially showing a method of manufacturing a wiring substrate according to a first embodiment of the present invention. First, as shown in FIG. 1A, a temporary substrate 10 made of a nonwoven glass fabric epoxy resin which is composed by impregnating a nonwoven glass fabric with epoxy resin is prepared. Otherwise, a temporary substrate 10 formed by impregnating a nonwoven fabric made of another fiber such as aramid or liquid crystal polymer and the like with resin can be used.

One of features of this embodiment is to approximate a thermal expansion coefficient of the temporary substrate 10 to a thermal expansion coefficient of a build-up wiring layer to be formed thereon. For this reason, the temporary substrate 10 made of the above-described materials is employed herein, and the thermal expansion efficient thereof is set in a range from 30 ppm/° C. to 50 ppm/° C. Meanwhile, wiring formation regions A for obtaining wiring substrates are respectively defined on both surfaces of the temporary substrate 10. It is possible to define a single wiring formation region A on each surface of the temporary substrate 10. Alternatively, it is possible to define a plurality of wiring formation regions A on each surface thereof.

Figure 1B:
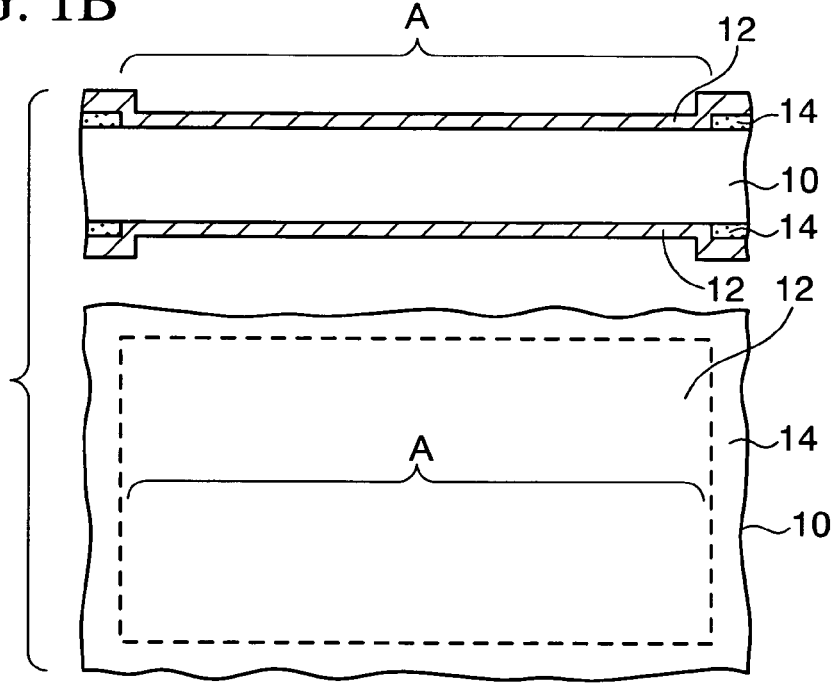

Thereafter, as shown in FIG. 1B, copper foils 12 (metal foils) in the thickness from 12 μm to 18 μm are prepared, and the copper foils 12 are tentatively fixed to the entirety of the both surfaces of the temporary substrate 10, respectively, by selectively attaching peripheral sides of each of the copper foils 12 to outer peripheral portions of the wiring formation regions A on each side of the temporary substrate 10 by use of an adhesive layer 14. At this time, the copper foil 12 is attached onto the temporary substrate 10 in a vacuum atmosphere and no adhesive layer 14 is provided in a center principal portion of the copper foil 12. Accordingly, the copper foil 12 is in a state of being simply in contact with the temporary substrate 10 at the center principal portion. For this reason, the center principal portion of the copper foil 12 can be easily separated from the temporary substrate 10 later. Here, in addition to the copper foils 12, it is possible to use other thin-film metallic materials such as aluminum foils.

Figure 1C:
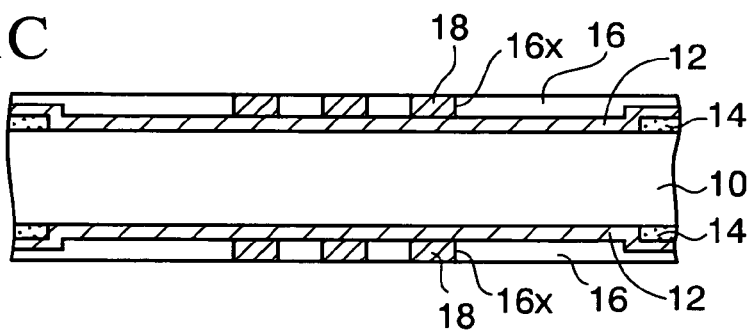
Figure 1D:
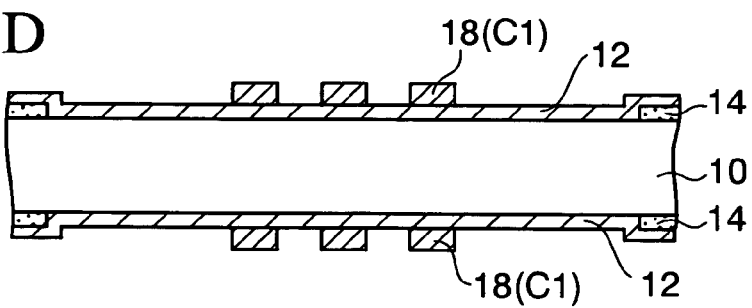

Subsequently, as shown in FIG. 1C, plating resist films 16 provided with openings 16x at desired portions are formed on the both surfaces of the temporary substrate 10. Moreover, first wiring layers 18 made of gold (Au), nickel (Ni), tin (Sn) or the like are formed in the openings 16x of the plating resist films 16 by electrolytic plating while using the copper foils 12 as plating power-supply layer. Thereafter, as shown in FIG. 1D, the plating resist films 16 are removed. The first wiring layers 18 function as internal connection pads C1 as described later.

Figure 1E:
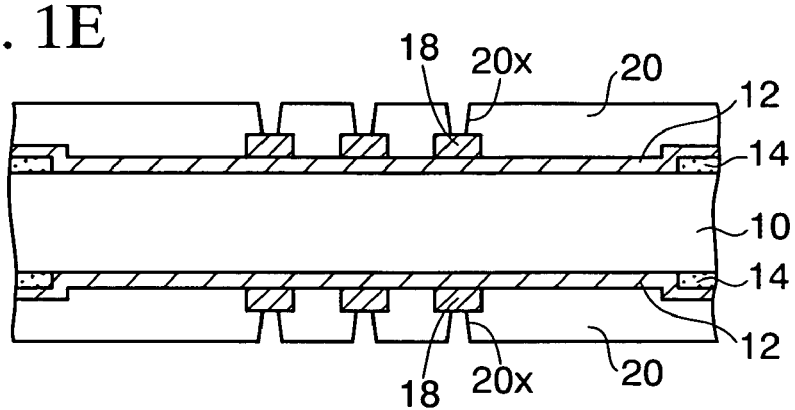

Subsequently, as shown in FIG. 1E, first insulating layers 20 for covering the first wiring layers 18 are formed on the both surfaces of the temporary substrate 10 respectively. As the material of the first insulating layers 20, an epoxy resin, a polyimide resin or the like is used. In an example of a method of forming the first insulating layers 20, the first insulating layers 20 are obtained by laminating resin films respectively on the both surfaces of the temporary substrate 10, and thereafter, hardening the resin films by a heat treatment at a temperature in a range from 130° C. to 150° C. while pressing (pressurizing) the resin films.

Subsequently, as shown in FIG. 1E again, the first insulating layers 20 are processed with a laser or the like so as to expose the first wiring layers 18 on the both surfaces of the temporary substrate 10, thereby forming first via holes 20x, respectively.

Here, the first insulating layers 20 may be formed by patterning a photosensitive resin film by means of photolithography, or by patterning resin films provided with openings by means of screen printing.

Figure 1F:
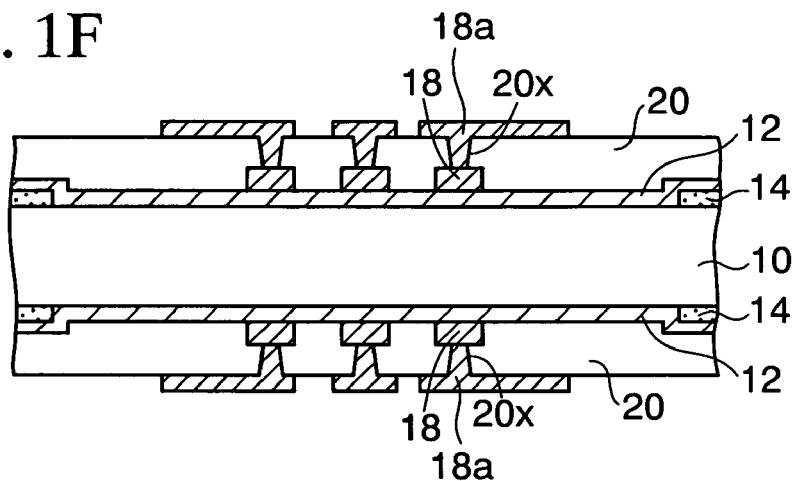

Subsequently, as shown in FIG. 1F, second wiring layers 18a made of copper (Cu) or the like, which are connected to the first wiring layers 18 through the first via holes 20x, are respectively formed on the first insulating layers 20 of both surfaces side of the temporary substrate 10. The second wiring layers 18a are formed by a semi-additive method, for example. To be more precise, first, Cu seed layers (not shown) are formed inside the first via holes 20× and on the first insulating layers 20 by means of electroless plating, or by a sputtering method. Thereafter, resist films (not shown) having openings corresponding to the second wiring layers 18a are formed thereon. Subsequently, Cu layer patterns (not shown) are formed in the openings of the resist films by means of electrolytic plating while using the Cu seed layers as plating power-supply layer. Subsequently, the resist layers are removed and then the second wiring layers 18a are obtained by etching the Cu seed layers while using the Cu layer patterns as masks. In addition to the aforementioned semi-additive method, it is possible to employ various other wiring formation methods such as a subtractive method as the method of forming the second wiring layers 18a.

Figure 1G:
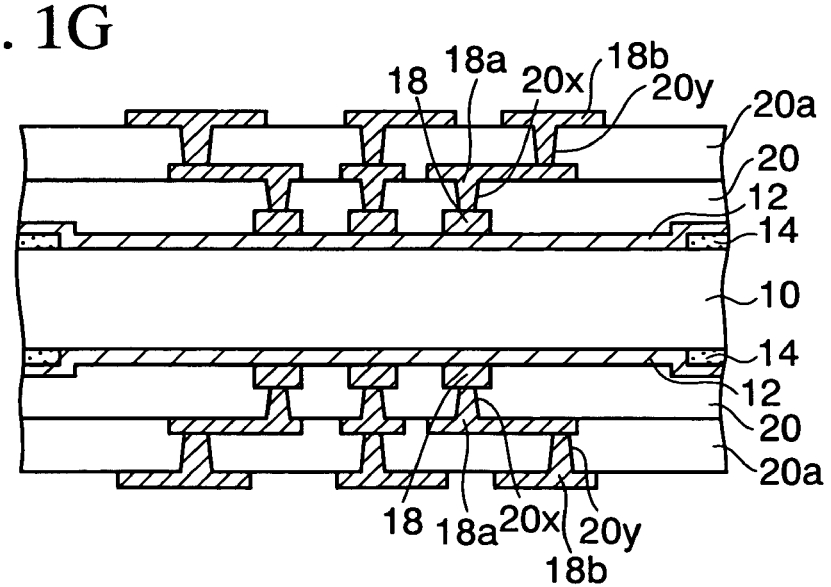

Then, as shown in FIG. 1G, second insulating layers 20a for covering the second wiring layers 18a are respectively formed on the both surfaces of the temporary substrate 10 by repeating similar processes, and then second via holes 20y are respectively formed at portions on the second insulating layers 20a on the second wiring layers 18a. Furthermore, third wiring layers 18b to be connected to the second wiring layers 18a through the second via holes 20y are formed respectively on the second insulating layers 20a on the both surfaces of the temporary substrate 10.

Figure 1H:
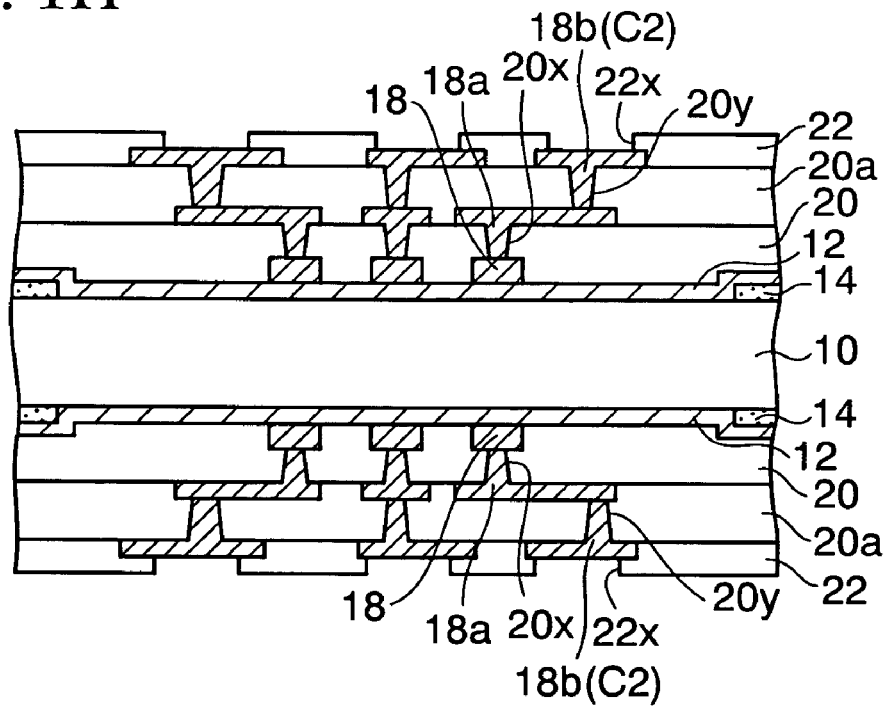

Subsequently, as shown in FIG. 1H, solder resist films 22 provided with openings 22x on the third wiring layers 18b are respectively formed on the both surfaces of the temporary substrate 10. As a consequence, the third wiring layers 18b exposed inside the openings 22x of the solder resist films 22 constitute external connection pads C2. Here, it is possible to form contact layers such as Ni/Au plated layers on the third wiring layers 18b inside the openings 22x of the solder resist films 22 if it is necessary.

In this way, the desired build-up wiring layers are formed on the copper foils 12 above the temporary substrate 10. Although the three-layered build-up wiring layers (the first to third wiring layers 18 to 18b) are formed in the above-described example, it is possible to form n-layered (n is an integer equal to or greater than one) build-up wiring layers. Meanwhile, it is also possible to form a build-up wiring layer only on one surface of the temporary substrate 10.

As described above, in this embodiment, the copper foils 12 are tentatively fixed onto the temporary substrate 10 in a state that the peripheral sides of the copper foils 12 are selectively attached with the adhesive layers 14, and the center principal portions of the copper foils 12 are in a state of being simply in contact with the temporary substrate 10.

Accordingly, when the build-up wiring layer is formed on the copper foil 12, if each of thermal expansion coefficients are largely different between the temporary substrate 10 and the build-up wiring layer, wrinkles are easy to be generated in the build up wiring layer since the degrees of thermal expansion is difference between both of the constituents.

For example, in a case where a resin substrate containing a glass cloth (a woven fabric) is employed as the temporary substrate 10 differently from the case of this embodiment, the thermal expansion coefficient of the substrate ranges from 15 ppm/° C. to 17 ppm/° C. which is substantially smaller than the thermal expansion coefficient (20 ppm/° C. to 50 ppm/° C.) of the build up wiring layer. For this reason, the build-up wiring layer may expand larger upon heat application in the manufacturing process and thus, wrinkles are apt to be generated on the build-up wiring layer.

However, in this embodiment, the nonwoven glass fabric epoxy resin substrate is employed as the temporary substrate 10. This substrate has the thermal expansion coefficient in the range from 30 ppm/° C. to 50 ppm/° C., and it is therefore possible to approximate the thermal expansion coefficient to the average thermal expansion coefficient (20 ppm/° C. to 50 ppm/° C.) of the build-up wiring layer. The thermal expansion coefficient of the wiring layers (Cu) of the build-up wiring layer is around 18 ppm/° C., while the thermal expansion coefficient of the insulating layers (the resin) is in a range from 50 ppm/° C. to 60 ppm/° C. Accordingly, even when the heat is applied during the manufacturing process, the temporary substrate 10 and the build-up wiring layer expand almost in the same degree. Hence generation of wrinkles on the build-up wiring layer is prevented. In this way, it is possible to improve production yields and reliability of the build-up wiring layers.

Figure 1I:
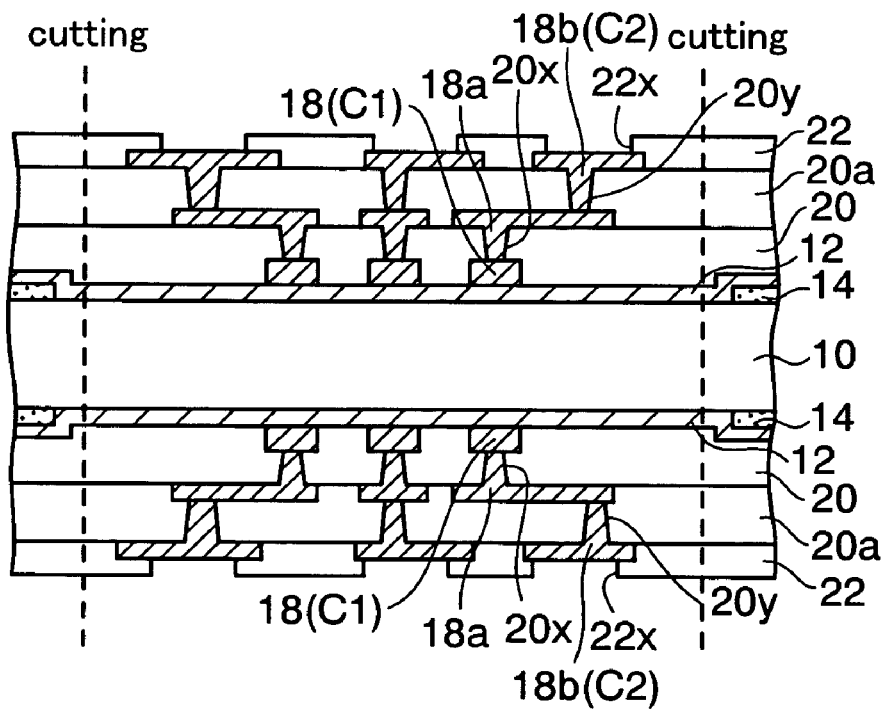
Figure 1J:
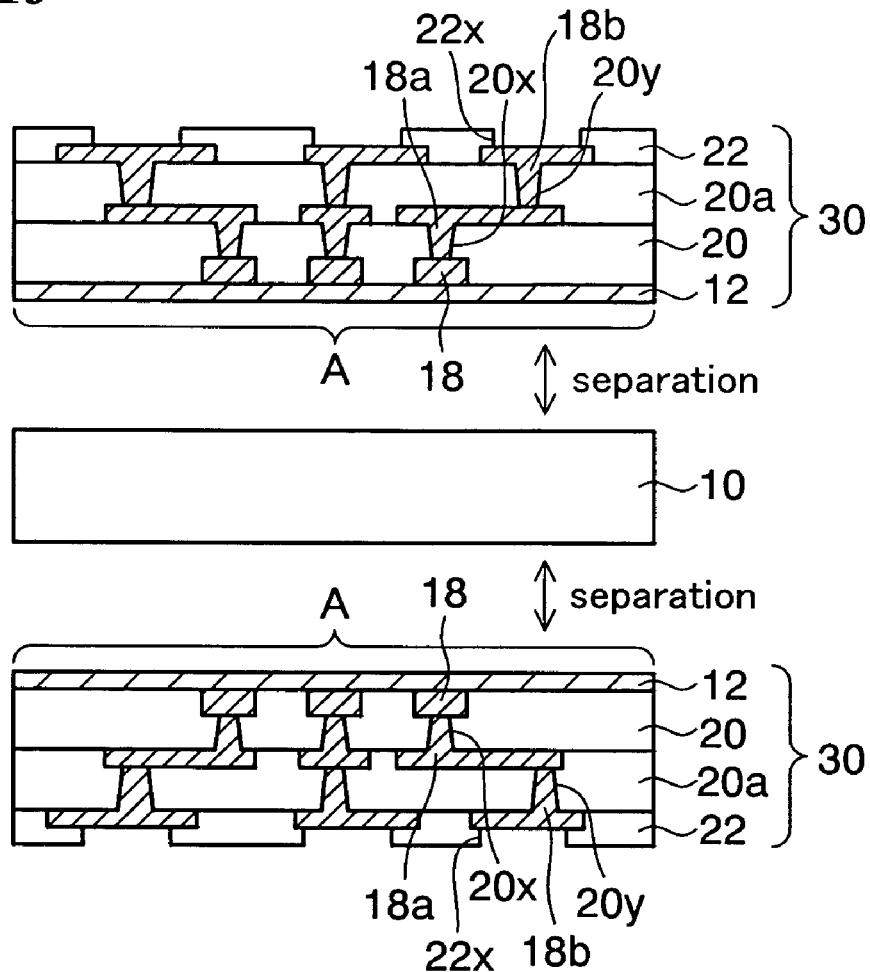

Subsequently, as shown in FIG. 1I, outside portions of the structure shown in FIG. 1H are removed by cutting inside portions from the adhesive layers 14 of the structure. In this way, as shown in FIG. 1J, the wiring formation regions A in which the temporary substrate 10 and the copper foils 12 simply contact each other are obtained, whereby the copper foils 12 and the build-up wiring layers formed thereon can be separated from the temporary substrate 10. Thus, wiring members 30 each including the copper foil 12 and the build-up wiring layer formed thereon are obtained from the both surfaces side of the temporary substrate 10 respectively.

Figure 1K:
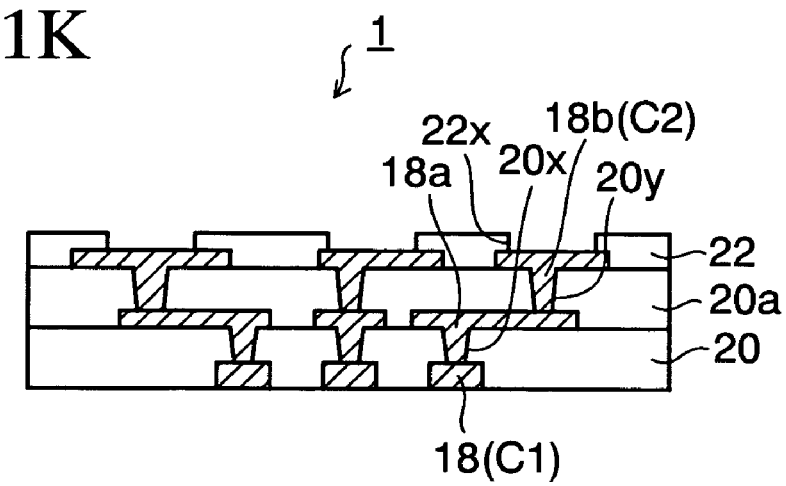

Thereafter, as shown FIG. 1K, the copper foil 12 of the wiring member 30 is selectively removed to the first wiring layer 18 and the first insulating layer 20. The copper foil 12 can be removed by selective etching to the first wiring layer 18 (such as gold) and the first insulating layer 20 by means of wet etching with a ferric chloride aqueous solution, a cupric chloride aqueous solution or an ammonium persulfate aqueous solution, for example.

Hence lower surfaces of the first wiring layers 18 are exposed and internal connection pads C1 are obtained. In this way, a wiring substrate 1 without a core substrate, of the first embodiment is manufactured. Here, instead of removing the copper foil 12, it is possible to form electrodes to be connected to the first wiring layer 18 by patterning the copper foil 12.

Figure 2:
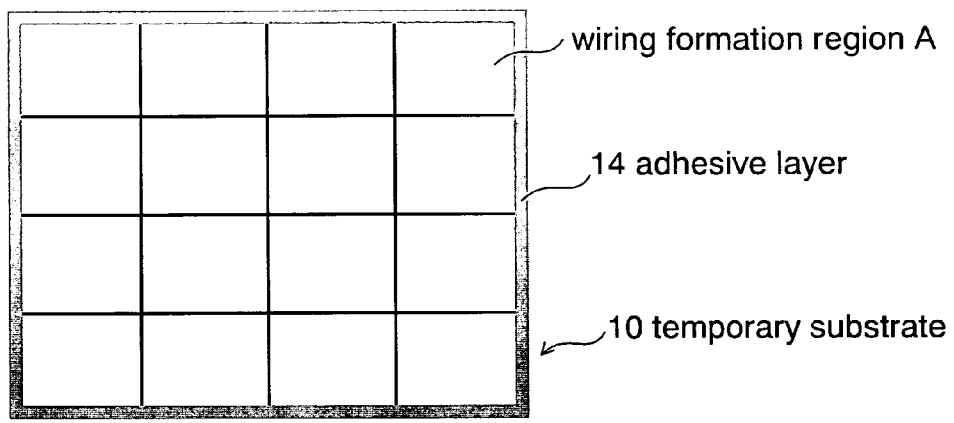
FIGS. 2 and 3 are plan views showing relations between wiring formation regions and regions for providing adhesive layers in the method of manufacturing a wiring substrate according to the first embodiment of the present invention.

In a preferred example of this embodiment, as shown in FIG. 2, a plurality of wiring formation regions A are defined on the temporary substrate 10, and the adhesive layer 14 is provided on an outer peripheral portion of a block region constituted by a plurality of wiring forming regions A, thereby the copper foils 12 are tentatively fixed to the temporary substrate. Then, the copper foils 12 are separated from the temporary substrate 10 by cutting out the inside portion being inward from the adhesive layers 14 of the structure, and after removing the copper foil 12, a circuit member 30 is divided to obtain individual wiring substrates.

Figure 3:
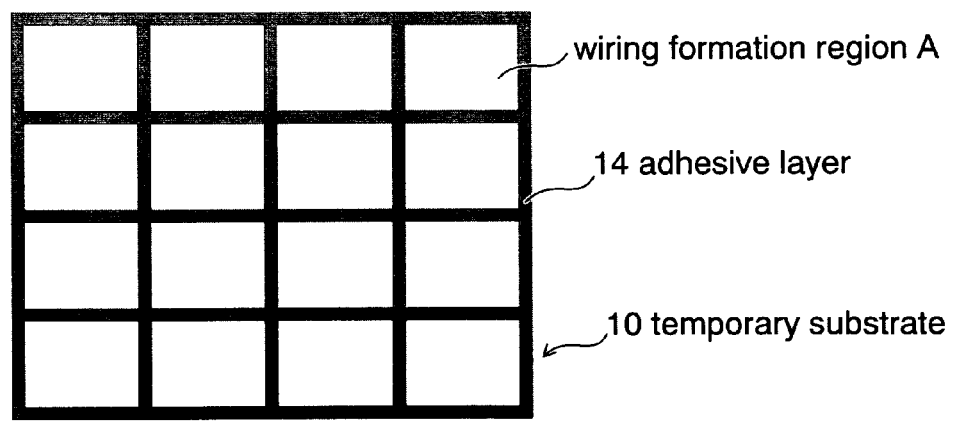

Alternatively, as shown in FIG. 3, it is possible to fix the copper foil 12 tentatively by providing the adhesive layer 14 on an outer peripheral portion of each of the wiring formation regions A on the temporary substrate 10. In this aspect, inner portions from the adhesive layers 14 of each of the wiring formation regions A are cut. Then, the individual circuit members 30 are obtained by separating the copper foil 12 from the temporary substrate 10, and then the copper foil is removed.

Meanwhile, in preferred example of this embodiment, a semiconductor chip is electrically connected to and mounted on the internal connection pads C1 (the first wiring layer 18), and external connection terminals are provided on the external connection pads C2 (the third wiring layer 18b).

As described above, in the method of manufacturing, a wiring substrate of this embodiment, the nonwoven glass fabric epoxy resin substrate is used as the temporary substrate 1. Then, the peripheral side of the copper foil 12 is attached thereto with the adhesive layer 14 and thereby fixing the copper foil 12 tentatively. Subsequently, the desired build-up wiring layer is formed thereon. Thereafter, the wiring member 30 is obtained by cutting out the inside portion to be inward from the portion provided with the adhesive layer 14 and thereby separating the copper foil 12 and the build-up wiring layer from the temporary substrate 10.

As explained previously, since the thermal expansion coefficient of the nonwoven glass fabric epoxy resin substrate is approximate to the thermal expansion coefficient of the build-up wiring layer, it is possible to resolve the problem where wrinkles are generated in the build-up wiring layer, even when the heat is applied in the manufacturing process. This is because the degrees of thermal expansion are almost equal between the temporary substrate 10 and the build-up wiring layer.

Second Embodiment

FIGS. 4A to 4F are cross-sectional views showing a method of manufacturing an electronic component mounting structure according to a second embodiment of the present invention. In the second embodiment, a preferred method of mounting an electronic component on a wiring substrate will be described based on a technical idea of the method of manufacturing a wiring substrate of the present invention.

Figure 4A:
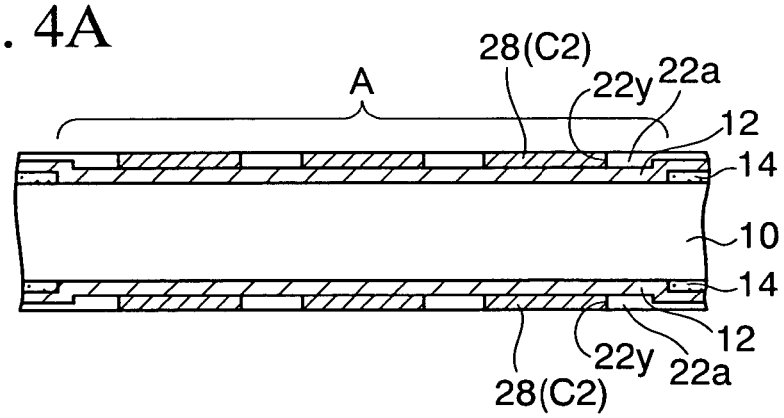
FIGS. 4A to 4F are cross-sectional views showing a method of manufacturing an electronic component mounting structure according to a second embodiment of the present invention.

First, as shown in FIG. 4A, a temporary substrate 10 made of a nonwoven glass fabric epoxy resin is prepared. Then, copper foils 12 are tentatively fixed to both surfaces of the temporary substrate 10, respectively, by selectively attaching peripheral sides of the copper foils 12 to outer peripheral portions of wiring formation regions A of the temporary substrate 10 with adhesive layers 14 as similar to the first embodiment.

Moreover, solder resist films 22a provided with openings 22y is formed on the copper foils 12 of the both surfaces side of the temporary substrate 10. Then, first wiring layers 28 are formed in the openings 22y of the solder resist films 22a by electrolytic plating. In the second embodiment, the internal connection pads C1 and the external connection pads C2 of the first embodiment are disposed with reversing up and down, and the first wiring layers 28 function as the external connection pads C2.

Figure 4B:
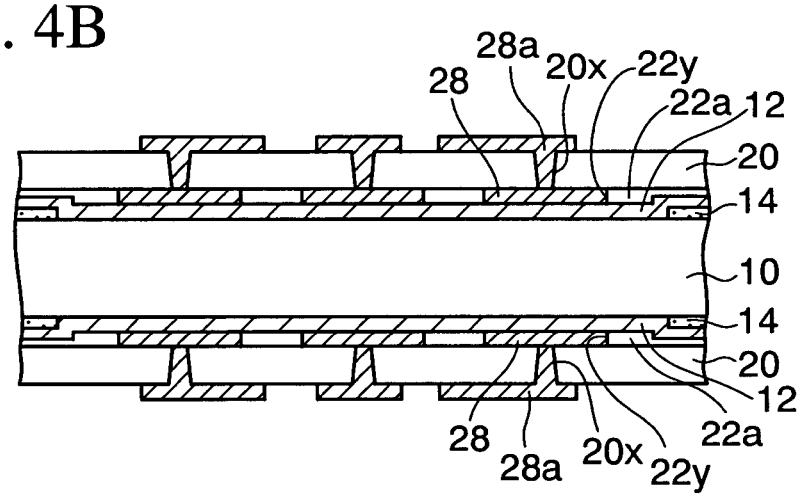

Next, as shown in FIG. 4B, first insulating layers 20 for covering the first wiring layers 28 are formed on the both surfaces side of the temporary substrate 10. Then, second wiring layers 28a to be connected to the first wiring layers 28 through first via holes 20x provided in the first insulating layers 20 are formed on the first insulating layers 20 respectively as similar to the first embodiment.

Figure 4C:
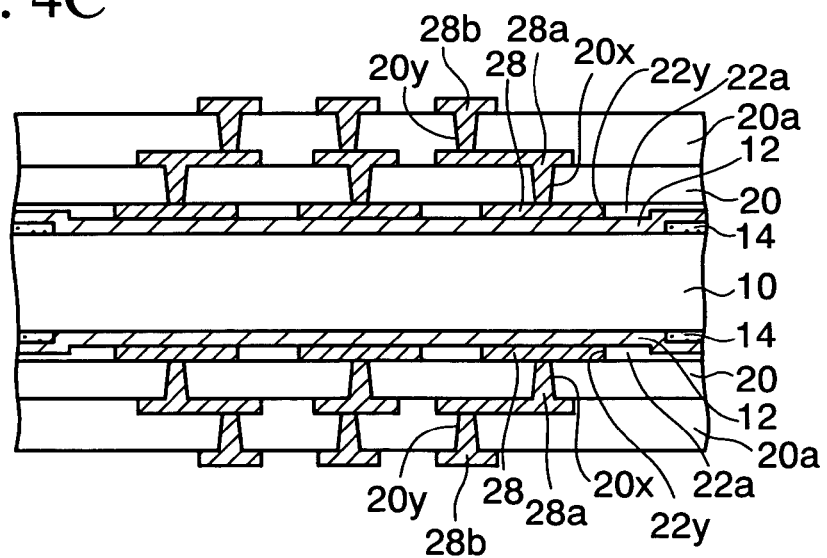

Subsequently, as shown in FIG. 4C, second insulating layers 20a for covering the second wiring layers 28a are formed on the both surfaces side of the temporary substrate 10. Then, second via holes 20y are formed in portions of the second insulating layers 20a on the second wiring layers 28a respectively. Moreover, third wiring layers 28b to be connected to the second wiring layers 28a through the second via holes 20y are formed on the second insulating layers 20a on the both surfaces of the temporary substrate 10 respectively.

Figure 4D:
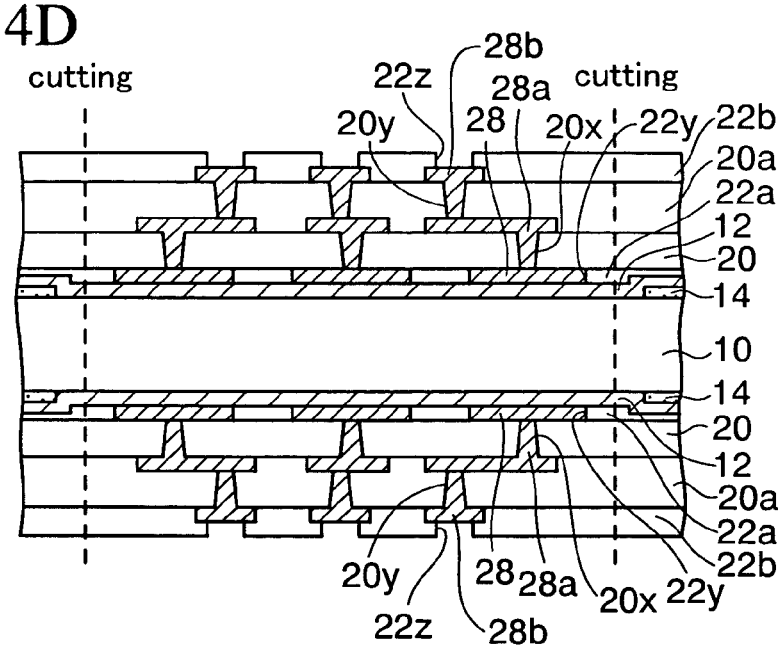

Next, as shown in FIG. 4D, solder resist films 22b provided with openings 22z are formed on the third wiring layers 28b. Then, in the second embodiment, exposed portions of the third wiring layers 28b constitute internal connection pads C1.

Figure 4E:
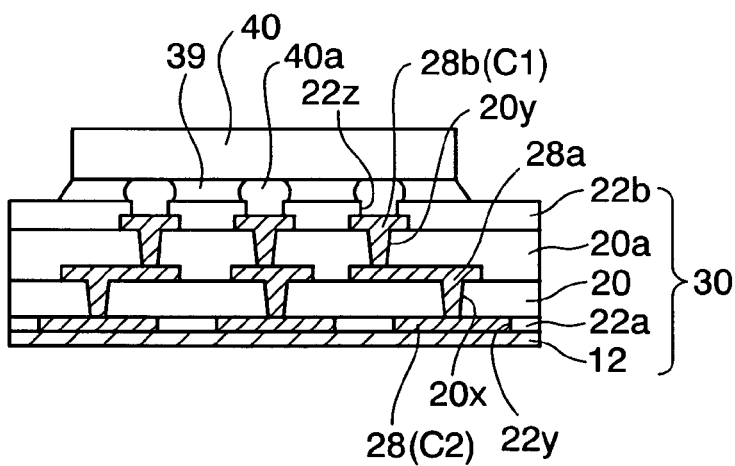

Next, as shown in FIG. 4D again, inside portions of the structure, the portion being inward from the adhesive layers 14 formed therein as shown in FIG. 4D are cut out as similar to the first embodiment. In this way, as shown in FIG. 4E, wiring members 30 having the structure in which build-up wiring layers are formed on the copper foils 12 are obtained. Furthermore, a semiconductor chip 40 (an electronic component) having bumps 40a is prepared and the bumps 40a of the semiconductor chip 40 are connected to the internal connection pads C1 on an upper side of the wiring member 30 by flip-chip bonding. Moreover, underfill resin 39 is filled into an interstice of a lower side of the semiconductor chip 40.

Here, the semiconductor chip 40 is used as an example of the electronic component. However, it is possible to mount various electronic components such as a capacitor component. Moreover, in addition to flip-chip bonding, various mounting methods such as a wire bonding method may be employed as the method of mounting the electronic component.

In this embodiment, the copper foil 12 which functions as a reinforcing member remains in the wiring member 30 when mounting the semiconductor chip 40. Accordingly, it is easy to convey or handle the wiring member 30 by avoiding occurrence of warp. In this way, it is possible to mount the semiconductor chip 40 with high reliability.

Figure 4F:
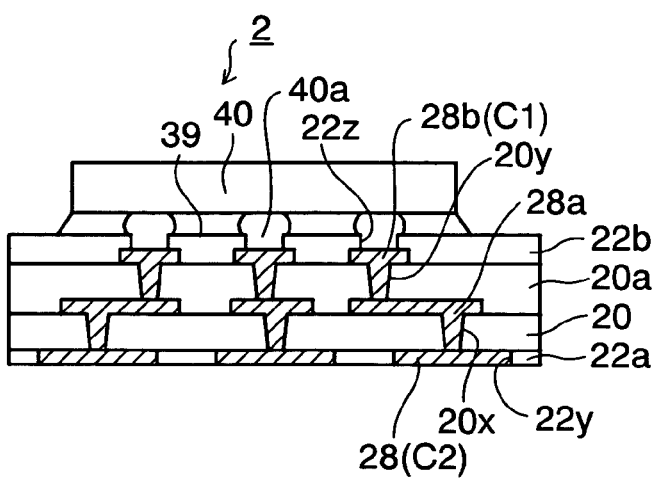

Thereafter, as shown in FIG. 4F, the external connection pads C2 (the first wiring layers 28) are exposed on the lower side by removing the copper foil 12 from the wiring member 30. Here, in a case where the conveyance or handling does not become a problem, it is possible to mount the semiconductor chip 40 after removing the copper foil 12.

In the manner described above, an electronic component mount structure 2 (a semiconductor device) of the second embodiment is obtained.

Figure 5A:
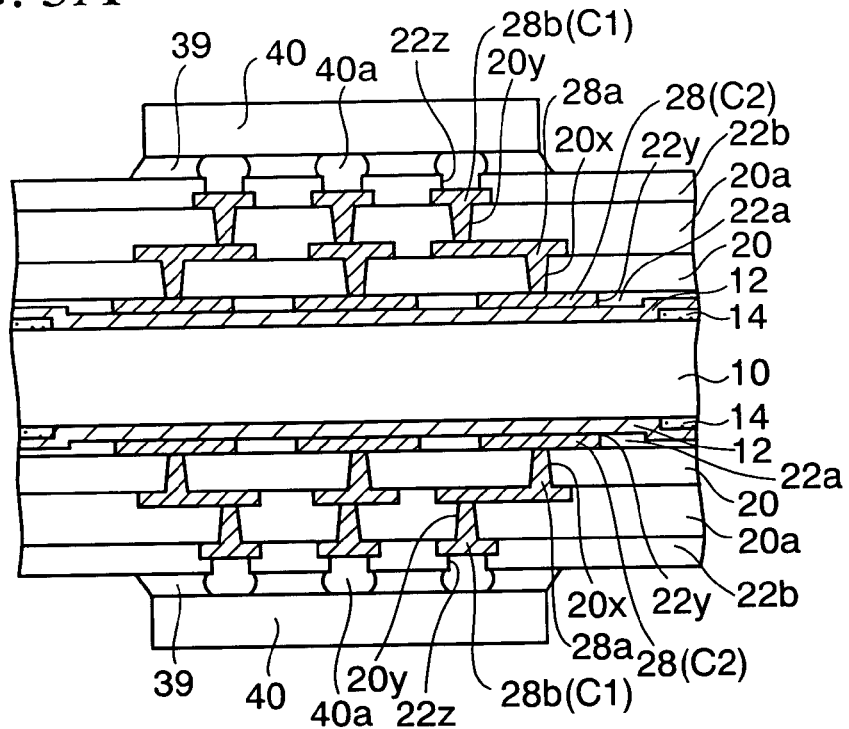
FIGS. 5A to 5D are cross-sectional views showing a method of manufacturing an electronic component mounting structure according to a variation of the second embodiment of the present invention.

FIGS. 5A to 5D show a method of manufacturing an electronic component mount structure according to a variation of the second embodiment. As shown in FIG. 5A, it is possible to connect the bumps 40a of the semiconductor chips 40 to the internal connection pads C1 (the third wiring layers 28b) on the both surfaces by flip-chip bonding before cutting out the structure as described in FIG. 4D.

Figure 5B:
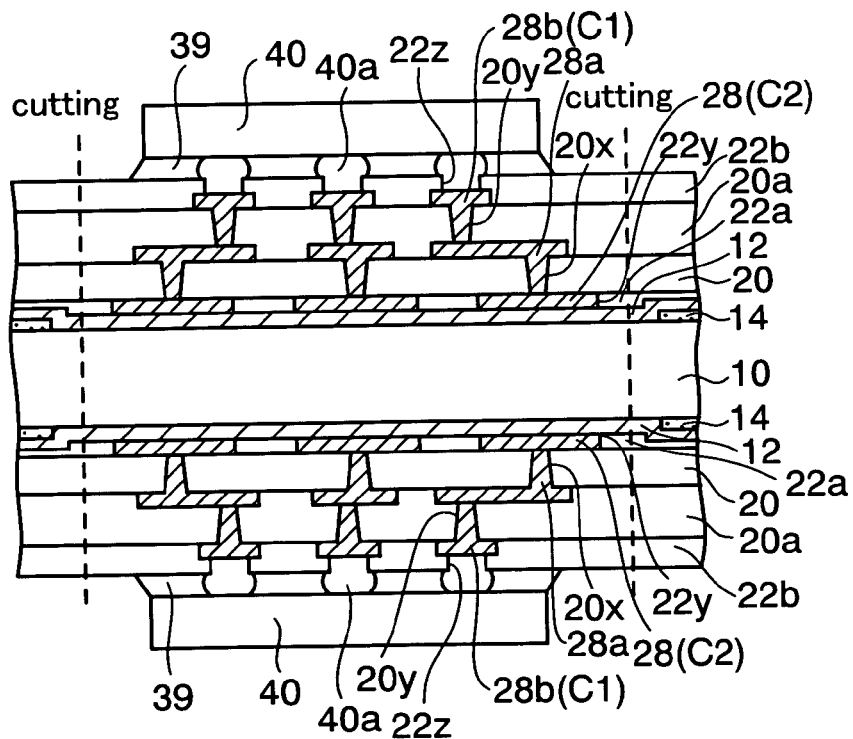
Figure 5C:
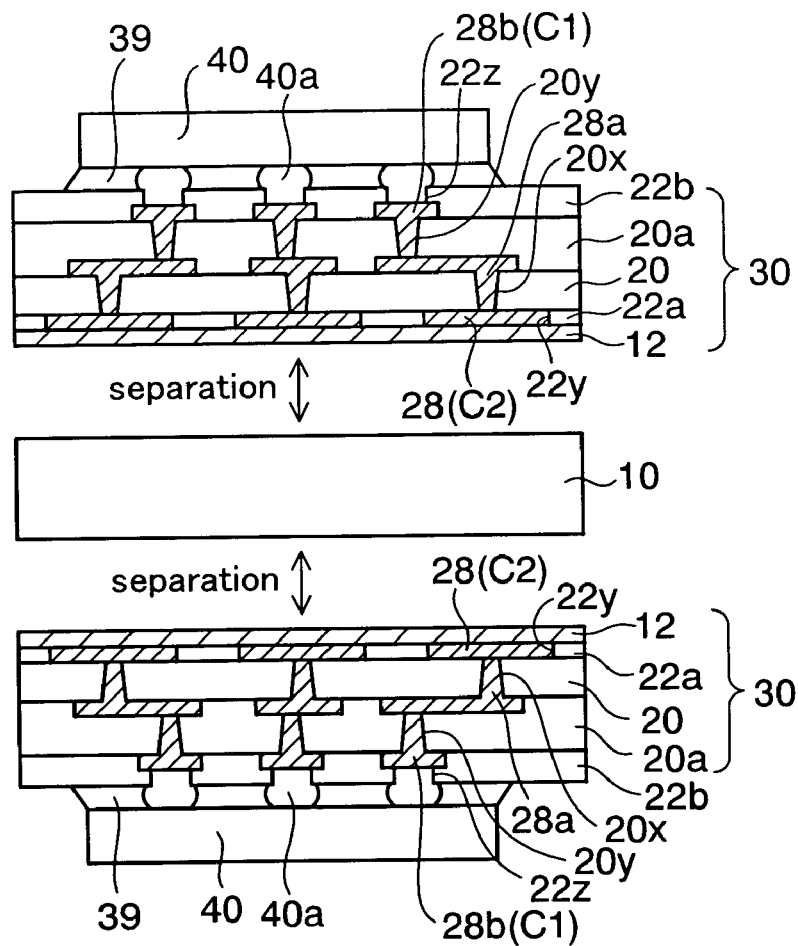

Thereafter, as shown in FIG. 5B, inside portions being inward from the adhesive layers 14 of the structure in FIG. 5A are cut out. In this way, the copper foils 12 are separated from the temporary substrate 10 as shown in FIG. 5C, and each of the structures, in which the semiconductor chip 40 is mounted on the wiring member 30 composed of the copper foil 12 and the build-up wiring layer formed thereon are obtained from the both surfaces side of the temporary substrate 10. Furthermore, as shown in FIG. 5D, the external connection pads C2 (the first wiring layer 28) are exposed by removing the copper foil 12 from the wiring member 30.

Also, in the variation, the semiconductor chip is mounted on the wiring member 30 provided on the temporary substrate 10. Accordingly, it is possible to mount the semiconductor chip with high reliability without receiving an influence of warp and the like.

Figure 5D:
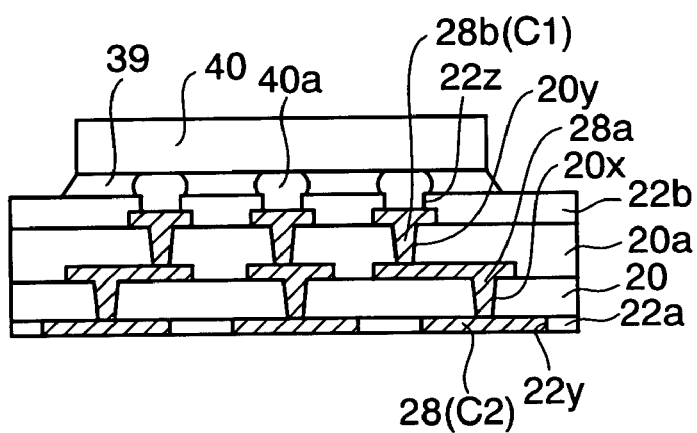

FIG. 4F and FIG. 5D show examples of adopting a land grid array (LGA) type as an external connection type, and the external connection pads C2 are used as lands. In a case where

What is claimed is:

1. A method of manufacturing a wiring substrate, comprising the steps of:
preparing a temporary substrate made of a nonwoven glass fabric impregnated with resin and preparing a metal foil;
tentatively fixing the metal foil onto at least one surface of the temporary substrate by selectively attaching a peripheral side of the metal foil to a peripheral portion of a wiring formation region on the temporary substrate with an adhesive layer,
wherein there is no adhesive layer in a center principal portion of the metal foil; and the metal foil is simply in contact with the temporary substrate at the center principal portion, whereby the center principal portion of the metal foil is easily separable from the temporary substrate later;
forming a build-up wiring layer on the metal foil; and
obtaining a wiring member in which the build-up wiring layer is formed on the metal foil, by cutting out an inside portion of a structure in which the metal foil and the build-up wiring layer is formed on the temporary substrate, the portion being inward from the adhesive layer formed therein, and thus by separating the metal foil from the temporary substrate.

2. The method of manufacturing a wiring substrate according to claim 1, further comprising the step of: removing the metal foil after the step of obtaining the wiring member.

3. The method of manufacturing a wiring substrate according to claims 1, wherein a thermal expansion coefficient of the temporary substrate is in a range from 30 ppm/° C. to 50 ppm/° C., and a thermal expansion coefficient of the build-up wiring layer is in a range from 20 ppm/° C. to 50 ppm/° C.

4. The method of manufacturing a wiring substrate according to claim 2,
wherein a lowermost wiring layer of the build-up wiring layer exposed in the step of removing the metal foil constitutes an internal connection pad for mounting an electronic component, and
an uppermost wiring layer of the build-up wiring layer constitutes an external connection pad.

5. The method of manufacturing a wiring substrate according to claim 2,
wherein a lowermost wiring layer of the build-up wiring layer exposed in the step of removing the metal foil constitutes an external connection pad, and
an uppermost wiring layer of the build-up wiring layer constitutes an internal connection pad for mounting an electronic component.

6. The method of manufacturing a wiring substrate according to claims 1,
wherein the metal foil and the build-up wiring layer are formed on each of both surfaces side of the temporary substrate, and
the wiring members are respectively obtained from the both surfaces side of the temporary substrate.

7. The method of manufacturing a wiring substrate according to claim 3,
wherein the metal foil and a wiring layer of the build-up wiring layer are made of copper, and
an insulating layer of the build-up wiring layer is made of resin.

8. A method of manufacturing an electronic component mounting structure comprising the steps of:
preparing a temporary substrate made of a nonwoven fabric impregnated with resin;
tentatively fixing a metal foil onto at least one surface of the temporary substrate, by selectively attaching a peripheral side of the metal foil to a peripheral portion of a wiring formation region on the temporary substrate with an adhesive layer;
forming a build-up wiring layer on the metal foil;
obtaining a wiring member in which the build-up wiring layer is formed on the metal foil, by cutting out an inside portion of a structure in which the metal foil and the build-up wiring layer are formed on the temporary substrate, the portion being inward from the adhesive layer formed therein, and thus by separating the metal foil from the temporary substrate;
mounting an electronic component to be electrically connected to an uppermost wiring layer of the wiring member; and removing the metal foil from the wiring member.

9. A method of manufacturing an electronic component mounting structure comprising the steps of:
preparing a temporary substrate made of a nonwoven fabric impregnated with resin;
tentatively fixing a metal foil onto at least one surface of the temporary substrate, by selectively attaching a peripheral side of the metal foil to a peripheral portion of wiring formation region on the temporary substrate with an adhesive layer;
forming a build-up wiring layer on the metal foil;
mounting an electronic component to be electrically connected to an uppermost wiring layer of the build-up wiring layer;
obtaining a wiring member in which the electronic component is mounted on the build-up wiring layer formed on the metal foil, by cutting out an inside portion of a structure in which the metal foil and the build-up wiring layer are formed on the temporary substrate, the portion being inward from the adhesive layer formed therein, and thus by separating the metal foil from the temporary substrate; and
removing the metal foil from the wiring member.

10. The method of manufacturing an electronic component mounting structure according to claims 8,
wherein the metal foil and the build-up wiring layer are formed on each of both surfaces side of the temporary substrate, and
the wiring members are respectively obtained from the both surfaces side of the temporary substrate.

11. The method of manufacturing a wiring substrate according to claim 1, wherein the metal foil comprises copper having a thickness of between 12 μm and 18 μm.

12. The method of manufacturing a wiring substrate according to claim 1, wherein the metal foil comprises aluminum having a thickness of between 12 μm and 18 μm.

* * * * *